(12) United States Patent
Zong-Fu

(10) Patent No.: US 6,509,140 B1
(45) Date of Patent: Jan. 21, 2003

(54) MICROLENS FORMED OF NEGATIVE PHOTORESIST

(75) Inventor: Li Zong-Fu, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 159 days.

(21) Appl. No.: 09/709,873

(22) Filed: Nov. 10, 2000

Related U.S. Application Data

(62) Division of application No. 09/280,434, filed on Mar. 29, 1999, now Pat. No. 6,249,034.

(51) Int. Cl.⁷ .............................. G02B 1/04; G02B 3/00
(52) U.S. Cl. ........................................................ 430/321
(58) Field of Search .......................................... 430/321

(56) References Cited

U.S. PATENT DOCUMENTS 5,196,296 A * 3/1993 Watanabe et al. ........... 430/288
5,324,623 A * 6/1994 Tsumori ..................... 430/321

FOREIGN PATENT DOCUMENTS

| JP | 3-152973 A | * | 6/1991 |
| JP | 3-190169 A | * | 8/1991 |

* cited by examiner

*Primary Examiner*—John A. McPherson
(74) *Attorney, Agent, or Firm*—Trop, Pruner & Hu, P.C.

(57) ABSTRACT

By forming a microlens of negative photoresist, economical microlens fabrication processes may be used which, in some embodiments, may achieve microlenses having good optical clarity and high thermal stability. In one embodiment, a positive photoresist may be used as a pattern mask to transfer a pattern to the negative photoresist. The microlenses may be formed by dry etching the positive photoresist which acts as a mask to transfer a pattern to the underlying negative photoresist. At the same time a scratch protection layer may be formed over regions not overlying optical sensors.

7 Claims, 3 Drawing Sheets

MICROLENS FORMED OF NEGATIVE PHOTORESIST

This is a divisional of prior application Ser. No. 09/280,434 filed Mar. 29, 1999, now U.S. Pat. No. 6,249,034.

BACKGROUND

This invention relates generally to microlens arrays for various applications including increasing the fill factor of photosensitive arrays.

Conventional imaging systems may include a light sensing element such as a charge coupled device (CCD) or a complementary metal oxide semiconductor (CMOS) sensor. The sensor may include one or more metal layers and interconnects, interlayer dielectric (ILD), a passivation layer such as a nitride layer, a color filter array (CFA), planarization over the CFA and a microlens array over the CFA. Conventionally, microlens arrays are formed using positive photoresist materials.

Conventional microlens fabrication involves forming a nitride passivation, and then opening a pond pad. A polyimide layer is used to transfer a pattern to the positive photoresist. The polyimide layer is removed and a color filter array is formed. Thereafter, the device is planarized. Microlenses are defined in positive photoresist and then an ultraviolet (UV) bleaching step is used to improve the transmissivity or optical clarity of the positive photoresist.

Conventional processes may produce striations. In conventional Processes, the bond pad opening is formed before CFA formation. The topographic variation due to the surface cavity in the bond pad areas is a direct source of streaking patterns in CFAs which may later cause streaking in the resulting images.

Photobleaching may be used with positive photoresist because of the yellowing that may occur during processing. In addition positive photoresists are inherently not transparent, even after a hard bake. This is believed to be due at least in part to the presence of photoacid compounds in positive photoresist. Thus, the positive photoresist based microlenses are photobleached using a deep ultraviolet (UV) source. Even with bleaching, a yellowing problem may arise upon exposure to heat and humidity.

With existing positive photoresist microlens formation processes, the bond pads may be left with residues because the bond pad opening is formed before the microlens is formed. Thus, a final bond pad area opening may be covered with residuals preventing good contact to the bond pad.

The thermal stability of positive photoresists is also limited. When exposed to high temperatures, positive photoresist may change shape or lose its optical clarity. Thus, it is generally desirable to avoid high temperatures with positive photoresist based microlens arrays. However, avoiding high temperatures prevents using the surface mount process where the silicon chip and microlens can be heated up to over 200 degrees during the solder reflow.

Additionally, in conventional processes, the regions adjacent to the microlenses, which are not situated over photosensitive elements, are subject to scratching during packaging because the nitride passivation is completely exposed. This scratching may ruin the devices and be an undetected source for light contamination.

Thus, there is a continuing need for improved photosensitive devices having improved microlens arrays.

SUMMARY

In accordance with one embodiment, a microlens may include a light collecting element. The element may be formed of negative photoresist.

DETAILED DESCRIPTION

A microlens may be formed from a negative photoresist layer. In one embodiment of the invention, shown in FIG. 1, a transfer layer such as a positive photoresist layer may be used to transfer a desired pattern to the negative photoresist layer. The microlens processing may be improved and simplified using negative photoresist. In addition, a scratch correction coating may be formed over the non-diode array area. The microlenses formed of negative photoresist may have high thermal stability and transparency in some embodiments.

Figure 1:
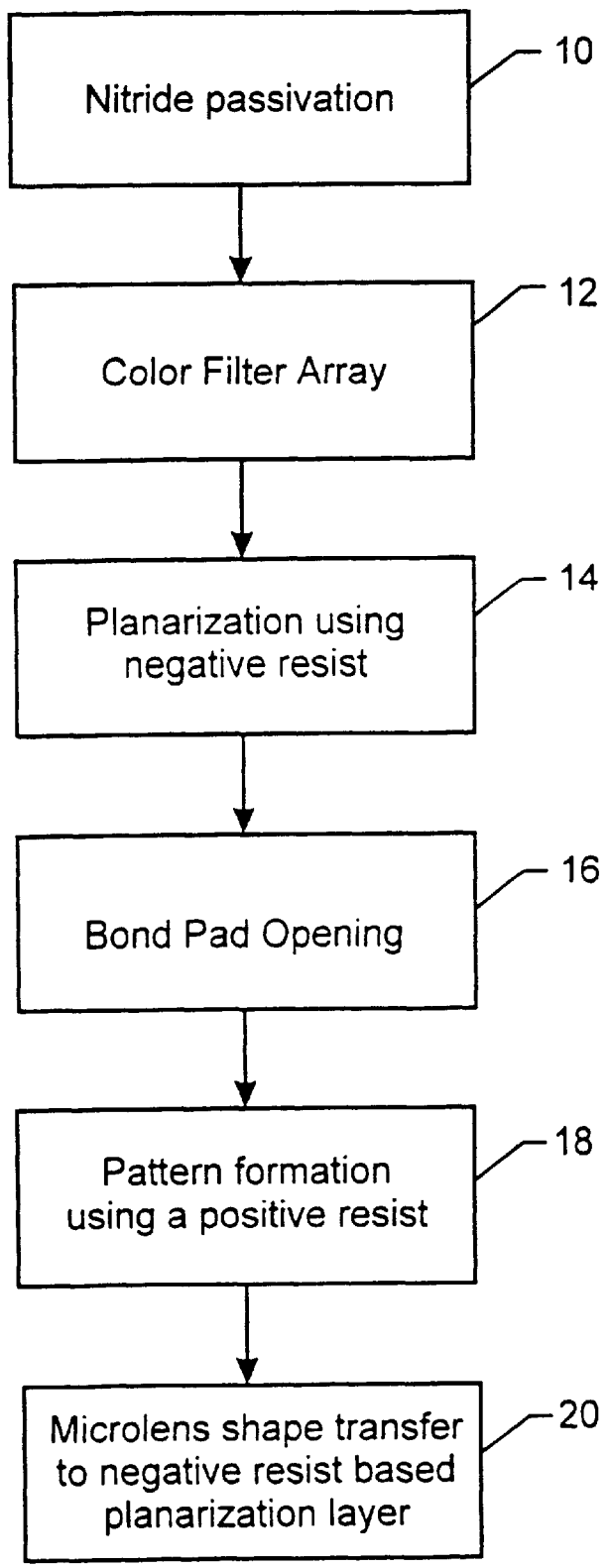
FIG. 1 shows the processing of the negative photoresist in accordance with one embodiment of the present invention.
Figure 2:
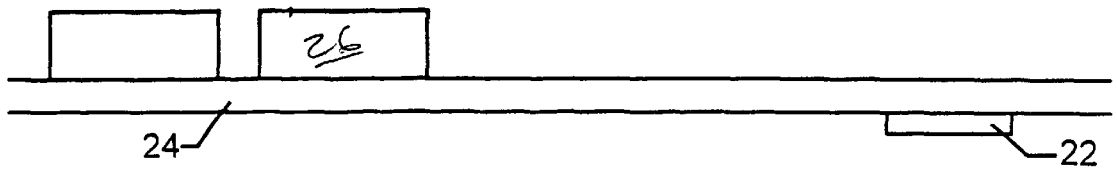
FIG. 2 is an enlarged cross-sectional view showing a microlens in the course of fabrication.

Referring to FIG. 1, in one embodiment of the invention, the process of forming a microlens of negative photoresist begins by using a conventional nitride passivation step as indicated in block 10. A color filter array (CFA) is then formed (block 12) over the nitride layer by deposition and patterning steps. Referring to FIG. 2, the nitride layer 24 may cover the bond pad 22. The CFA layer 26 may be deposited and patterned over the nitride passivation 24.

Figure 3:
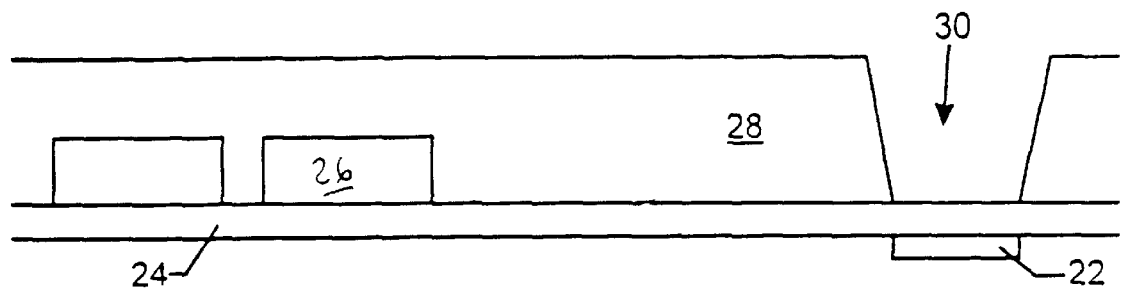
FIG. 3 is a cross-sectional view showing the microlens of FIG. 2 after ensuing processing.

Referring back to FIG. 1, the structure is then planarized (block 14) using negative photoresist. The negative photoresist may be the same negative photoresist that is conventionally used as the CFA resist. The CFA resist is typically an acrylic based negative photoresist. In some embodiments, the acrylic photoresist may be cross-linked for high thermal stability. For example, some negative photoresists can withstand temperatures over 200° C. for one hour without significant degradation in transmissivity. Other negative photoresists may be utilized as well. The negative photoresist 28 may be deposited by spin coating. The negative photoresist is then cured using conventional UV processing techniques. Referring to FIG. 3, after depositing the negative photoresist 28, an opening 30 may be formed (block 16, FIG. 1) to the bond pad using reactive ion etching (RIE)

Figure 4:
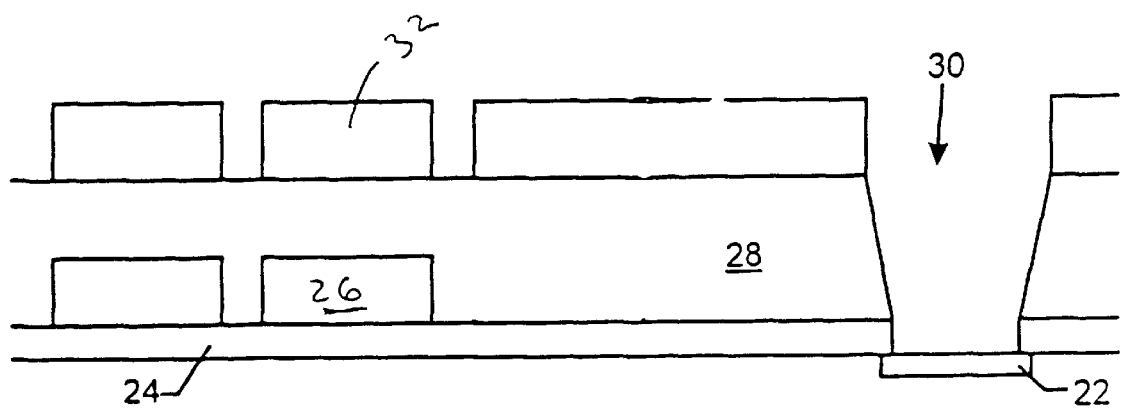
FIG. 4 is a cross-sectional view of the microlens structure of FIG. 3 after continued processing.

Returning now to FIG. 1, the pattern of the desired microlens array may be defined in the positive photoresist transfer layer, as indicated in block 18. Referring to FIG. 4, the positive photoresist may be spin coated on the cured negative photoresist layer and then patterned to create the desired array of microlenses as indicated at 32. The spin coated photoresist over the bond pad 22 is removed during patterning.

photoresist known as V259PA available from Nippon Chemical Company has desirable characteristics. Its formula is as follows:

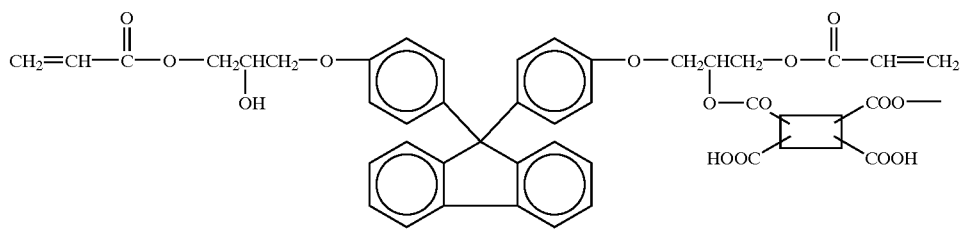

Figure 5:
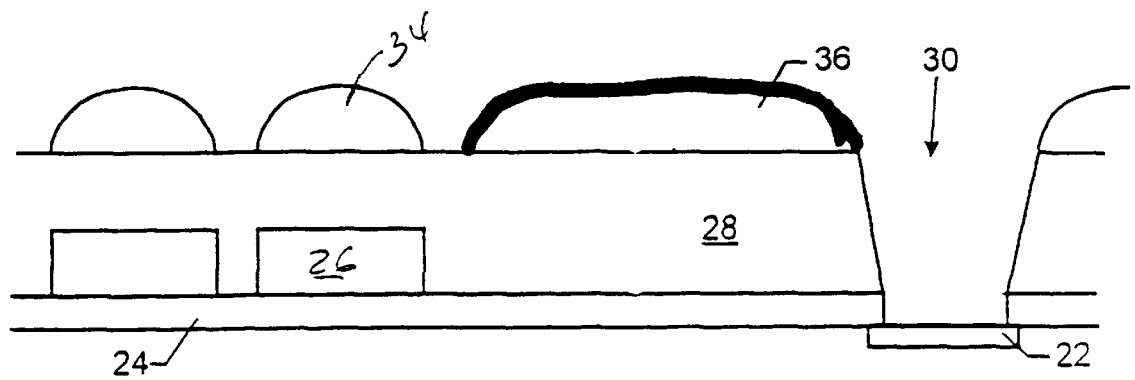
FIG. 5 is a cross-sectional view of the microlens structure of FIG. 4 after still additional processing.
Figure 6:
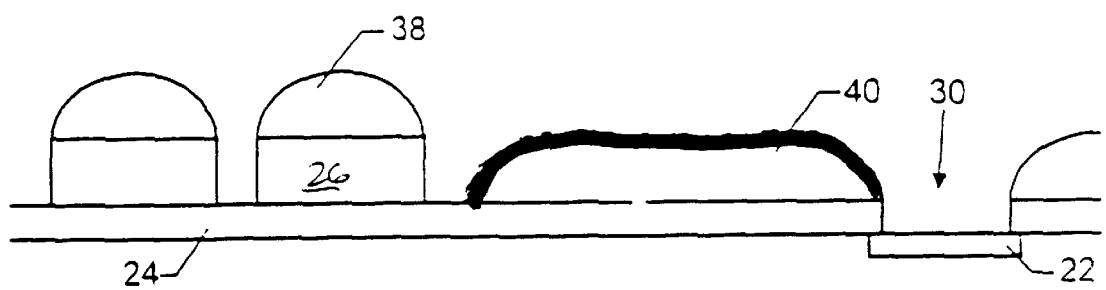
FIG. 6 is a cross-sectional view of the microlens of FIG. 5 after completion.

The desired microlens shape may then be transferred to the negative photoresist planarization layer as indicated in FIG. 1 at block 20 and in FIG. 5. Namely, the positive photoresist in block form, shown at 32 in FIG. 4, may be melted to form the oval shape indicated at 34 in FIG. 5. The pattern defined in the positive photoresist 32 may then be transferred to the negative photoresist 28 through dry etching as shown in FIG. 6. If desired, the dry etching step may be modified to increase or decrease the curvature of the resulting microlens 38. In addition, since the previous step is a dry etching step, for example, using plasma or RIE, it may automatically clean the bond pad 22. This avoids leaving residues that would contaminate the bond pads.

Figure 7:
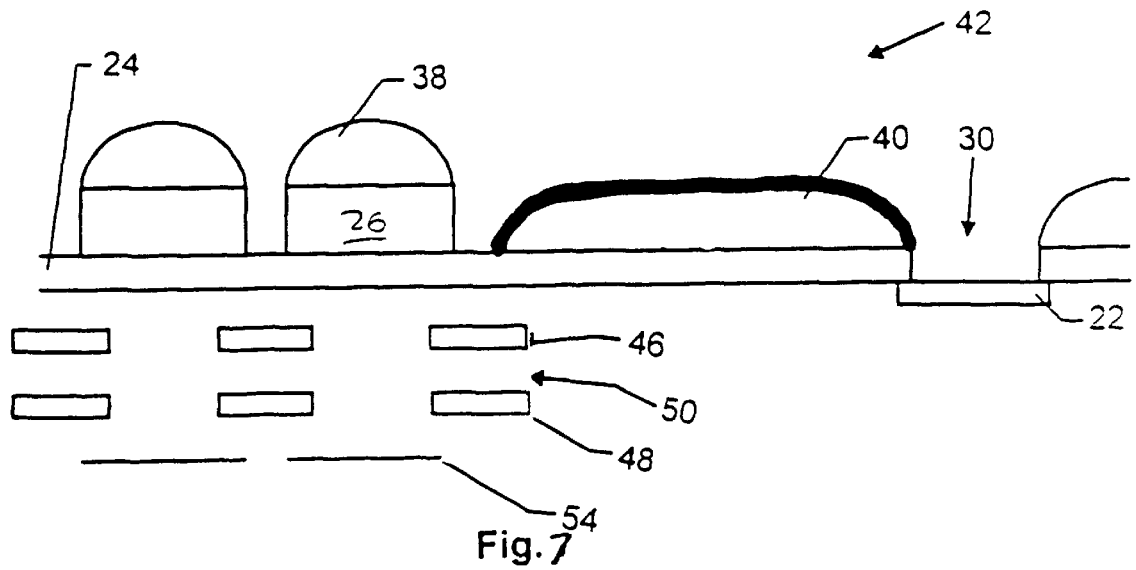
FIG. 7 is an enlarged cross-sectional view of a photosensitive device formed in accordance with one embodiment of the present invention.

In accordance with one embodiment of the present invention, the completed photosensitive array 42 may include a microlens array 38 as shown in FIG. 7. The CFA 26 may be situated over a nitride passivation layer 24. The metal layers 46 and 48 may be separated by the ILD 50. A photosensitive device 54, such as a photodiode, is situated under each microlens 38.

A negative resist protective coating 40 is formed over the regions which are not overlying the photosensitive devices 54. The coating 40 may be formed by the same steps that are used to form the microlens array 38. This provides a scratch prevention layer. Scratches in this region can adversely effect the performance of the photosensitive devices.

Use of the negative photoresist process may reduce or eliminates the need for the polyimide layer. Thus, polyimide ashing removal may be eliminated in some embodiments.

The CFA striation problem is also reduced or eliminated in some embodiments of the present invention since the bond pad opening is not done before CFA formation, in some embodiments. Photobleaching and the yellowing issue may be avoided since the negative photoresist does not require bleaching. The negative photoresist also has high thermal stability and can withstand heating to temperatures over 200° C. for one hour without significant degradation in optical properties.

The positive photoresist used for pattern transfer may be a relatively commonplace photoresist as opposed to special formulations currently used as microlens resist. A suitable positive photoresist is AZ4620 from Shipley Company, Marlborough, Mass. The use of common positive photoresists may result in a cost saving compared to photoresists used in conventional microlens formation processes.

In some embodiments, a high stability, high transparency negative photoresist may be based on an epoxy acrylate resin. Particularly, epoxy acrylates having the fluorene moiety are particularly desirable. For example, the negative A hydroxide may be reacted with anhydride (indicated as a rectangle above) to form a copolyester. The anhydride block may also contain a carboxylic group. The base resin may be advantageous over common acrylic resists because he fluorene pendent groups impart a nigh transparency to the microlens. The carboxylic groups may enhance the base resin solubility in alkaline solutions while producing good wetting adhesion to substrates. The base resin also exhibits low volume shrinkage during curing as compared to aliphatic acrylate.

The epoxy acrylates may have high glass transition temperatures on the order of 250° C. versus 180° C. for aliphatic acrylate systems. The epoxy acrylate may exhibit 90 percent light transmittance for 400–800 nm. after heating to 200° C. for one hour and then 280° C. for another hour.

While the present invention has been described with respect to a limited number of embodiments, those skilled in the art will appreciate numerous modifications and variations therefrom. It is intended that the appended claims cover all such modifications and variations that fall within the true spirit and scope of the present invention.

What is claimed is:

1. A method of forming a microlens comprising:
   forming a negative photoresist layer including epoxy acrylate;
   forming a pattern transfer layer over said negative photoresist layer; and
   using said pattern transfer layer as a mask to define microlenses in said negative photoresist layer.

2. The method of claim 1, wherein forming a negative photoresist layer includes forming an epoxy acrylate having a fluoene moiety.

3. The method of claim 1, wherein forming a pattern transfer layer includes forming a positive photoresist layer over said negative photoresist layer.

4. The method of claim 1, further including forming a microlens over a photosensitive device and further forming a scratch protection layer over regions not overlying a photosensitive device.

5. The method of claim 1, including forming a color filter array, and depositing, said negative photoresist over said color filter array.

6. The method of claim 5 including opening bond pads after forming negative photoresist over the color filter array.

7. The method of claim 6, wherein using the pattern transfer layer as a mask to define microlenses includes dry etching the pattern transfer layer to define the shape of the underlying negative photoresist.

* * * * *

UNITED STATES PATENT AND TRADEMARK OFFICE
CERTIFICATE OF CORRECTION

PATENT NO.   : 6,509,140 B1
DATED        : January 21, 2003
INVENTOR(S)  : Zong-Fu Li It is certified that error appears in the above-identified patent and that said Letters Patent is hereby corrected as shown below:

<u>Title page,</u>
Item [75], Inventor, "Li Zong-Fu" should be -- Zong-Fu Li --.

Signed and Sealed this

Eleventh Day of November, 2003

JAMES E. ROGAN
*Director of the United States Patent and Trademark Office*